(12) United States Patent
Sato

(10) Patent No.: US 8,888,915 B2
(45) Date of Patent: Nov. 18, 2014

(54) HIGH-PURITY VITREOUS SILICA CRUCIBLE USED FOR PULLING LARGE-DIAMETER SINGLE-CRYSTAL SILICON INGOT

(75) Inventor: Tadahiro Sato, Akita (JP)

(73) Assignee: Japan Super Quartz Corporation, Akita-Ken (JP)

( * ) Notice: Subject to any disclaimer, the term of this patent is extended or adjusted under 35 U.S.C. 154(b) by 1513 days.

(21) Appl. No.: 12/325,019

(22) Filed: Nov. 28, 2008

(65) Prior Publication Data

US 2009/0173276 A1    Jul. 9, 2009

(30) Foreign Application Priority Data

Dec. 14, 2007   (JP) ................... P2007-323420

(51) Int. Cl.
| | | |
|---|---|---|
| *C30B 35/00* | (2006.01) | |
| *C03B 19/09* | (2006.01) | |
| *C30B 15/10* | (2006.01) | |
| *C30B 29/06* | (2006.01) | |

(52) U.S. Cl.
CPC ............. *C03B 19/095* (2013.01); *C30B 15/10* (2013.01); *C30B 29/06* (2013.01); *C30B 35/002* (2013.01)
USPC .................... 117/213; 117/200; 427/376.2

(58) Field of Classification Search
USPC ............... 117/200, 213; 65/33; 427/376.2
See application file for complete search history.

(56) References Cited

U.S. PATENT DOCUMENTS

| | | | | |
|---|---|---|---|---|
| 6,136,092 | A  * | 10/2000 | Sato et al. ................ | 117/84 |
| 6,280,522 | B1 * | 8/2001 | Watanabe et al. ......... | 117/29 |
| 2008/0141929 | A1 * | 6/2008 | Kemmochi et al. ...... | 117/208 |
| 2009/0084308 | A1 * | 4/2009 | Kishi et al. ............... | 117/13 |

FOREIGN PATENT DOCUMENTS

| | | |
|---|---|---|
| EP | 1 408 015 | 4/2004 |
| JP | 11-171687 | 6/1999 |
| JP | 2005-145732 | 6/2005 |
| JP | 2005-255488 | 9/2005 |
| JP | 2006-124235 | 5/2006 |
| JP | 2007-153625 | 6/2007 |

OTHER PUBLICATIONS

English Language Abstract of JP 11-171687.
English Language Abstract of JP 2006-124235.
English Language Abstract of JP 2005-255488.
English language translation of patent abstract 2007-153625.
English language translation of patent abstract 2005-145732.

* cited by examiner

*Primary Examiner* — Matthew Song
(74) *Attorney, Agent, or Firm* — Greenblum & Bernstein, P.L.C.

(57) ABSTRACT

A high-purity vitreous silica crucible which has high strength and is used for pulling a large-diameter single-crystal silicon ingot, includes a double laminated structure constituted by an outer layer composed of amorphous silica glass with a bubble content of 1 to 10% and a purity of 99.99% or higher and an inner layer composed of amorphous silica glass with a bubble content of 0.6% or less and a purity of 99.99% or higher, and in the portion between the upper opening end of the high-purity vitreous silica crucible and the ingot-pulling start line of a silicon melt surface in the step of pulling a single-crystal silicon ingot, a portion corresponding to 40 to 100 volume % from the upper opening end of the crucible is in a crystalline structure free from the crystallization promoter.

1 Claim, 4 Drawing Sheets

HIGH-PURITY VITREOUS SILICA CRUCIBLE USED FOR PULLING LARGE-DIAMETER SINGLE-CRYSTAL SILICON INGOT

BACKGROUND OF THE INVENTION

1. Field of the Invention

The present invention relates to a high-purity vitreous silica crucible used for pulling a single-crystal silicon ingot for semiconductors, and more particularly, to a high-purity vitreous silica crucible with high strength which is capable of preventing generation of deformation, distortion, and the like while suppressing generation of pinhole defects in a single-crystal ingot when used for pulling a large-diameter single-crystal silicon ingot (hereinafter, simply referred to as single-crystal ingot).

Priority is claimed on Japanese Patent Application No. 2007-323420, filed on Dec. 14, 2007, the content of which is incorporated herein by reference.

2. Description of the Related Art

Conventionally, for a vitreous silica crucible used for pulling a single-crystal ingot, as a raw powder, high-purity vitreous silica powder with an average particle size of 200 to 300 μm and a purity of 99.99% or higher is used. Here, a gap formed between an inner surface of a graphite mold and an outer surface of a core, for example, a gap of 30 mm, is filled with the vitreous silica powder while the graphite mold is rotated at a speed of 60 to 80 rpm (see FIG. 3A). After filling the gap with the vitreous silica powder, the core is removed, and a silica powder compact is then formed. Thereafter, while the graphite mold is rotated at a speed of 50 to 100 rpm, a three-phase AC arc discharger using graphite electrodes is inserted through an upper opening of the silica powder compact. The inside of the graphite mold is heated to a temperature of about 2,000° C. by vertically reciprocating the arc discharger with respect to the inner surface of the graphite mold. At the same time, the silica powder compact is vacuumized through air passages which are open to the inner surface of the graphite mold, and the raw powder is melted and solidified, thereby manufacturing the silica crucible having a thickness of, for example, 10 mm (see FIG. 3B).

In addition, the vitreous silica crucible obtained by the aforementioned method has a double laminated structure constituted by an outer layer composed of high-purity amorphous vitreous silica glass with a bubble content (percentage of bubbles included in vitreous silica per unit volume) of 1 to 10% and a purity of 99.99% or higher and an inner layer composed of high-purity amorphous silica glass with a bubble content of 0.6% or less and a purity of 99.99% or higher, and a ratio in thickness between the inner layer and the outer layer is generally 1:1 to 5 (for example, see FIG. 2).

In addition, a single-crystal silicon ingot is manufactured by, as illustrated in FIG. 4, supplying a high-purity polysilicon mass to a vitreous silica crucible fixed to a graphite support, melting the polysilicon mass by using a heater provided along an outer circumference of the graphite support so as to be converted into a silicon melt, heating the silicon melt to the predetermined temperature in the range of 1,500 to 1,600° C. and maintaining the temperature, while rotating the vitreous silica crucible, in an Ar gas atmosphere under reduced pressure, simultaneously rotating a silicon seed crystal to be dipped into the silicon melt surface, and pulling the silicon seed crystal (JP-A-11-171687).

In addition, in the manufacturing of the single-crystal ingot, as also illustrated in FIG. 4, the silicon melt moves from a lower portion of the single-crystal ingot toward a lower portion of the crucible in the vitreous silica crucible, and flows upward from the lower portion of the crucible along an inner surface of the crucible, by convection flowing toward the lower portion of the single-crystal silicon ingot. Meanwhile, the silicon melt (Si) reacts with the inner surface ($SiO_2$) of the crucible to generate SiO gas. The generated SiO gas moves along with the convection of the silicon melt toward the silicon melt surface. Here, so as not to enable the generated SiO gas at the silicon melt surface to move into the single-crystal ingot under pulling and generate pinhole defects, the pulling condition is controlled to discharge the SiO gas to the pressure-reduced Ar gas atmosphere so as to be removed.

In addition, in order to extend a life-span of the vitreous silica crucible by preventing deformation and distortion of the vitreous silica crucible that may occur during the pulling of the single-crystal silicon ingot, techniques such as providing a crystallization promoter composed of, for example, oxides of alkaline-earth metals, hydroxide, carbonate, or the like, between the inner layer and the outer layer of the vitreous silica crucible (JP-A-2006-124235), or applying the crystallization promoter to an outer circumferential surface of an upper end portion of the opening of the crucible (JP-A-2005-255488) have been developed. In the techniques, during the melting and molding of the vitreous silica crucible, by the action of the crystallization promoter, an amorphous (glassy) structure is converted into a crystalline structure, thereby increasing the strength of the vitreous silica crucible.

Recently, as single-crystal ingots have been manufactured to have larger diameters, it has become possible for large-diameter single-crystal silicon ingots with diameters of 200 to 300 mm to be manufactured. Correspondingly, large-diameter vitreous silica crucibles with inner diameters of 610 to 810 mm have been needed. As a result, manufacturing large-diameter vitreous silica crucibles with a crystalline structure having high strength has become necessary. In the conventional vitreous silica crucible that obtained high strength by the action of the crystallization promoter to convert the amorphous structure into the crystalline structure, as the pulling time is lengthened due to the increase in diameter of the single-crystal ingots, by the action of the crystallization promoter existing in the crucible, the amorphous structure crystallizes even during pulling, more fine crystal grains are obtained, and crystal grain boundaries further increase. Reaction between the silicon melt (Si) and the inner surface ($SiO_2$) of the crucible actively occurs in the crystal grain boundaries as compared with the amorphous structure. In this aspect, with the increase in the crystal grain boundaries, an amount of the generated SiO gas significantly increases. In addition, the large amount of generated SiO gas cannot be sufficiently discharged to the pressure-reduced Ar gas atmosphere from the silicon melt surface so as to be removed. The residual generated SiO gas that is not removed moves to the lower portion of the single-crystal silicon ingot under pulling along with the flow of the silicon melt and is incorporated into the single-crystal silicon ingot causing pinhole defects.

Therefore, the inventor, according to the above-mentioned aspects, has carried out research related to the vitreous silica crucible used for pulling a large-diameter single-crystal ingot.

As a result, it has been observed that the strength of the vitreous silica crucible during pulling of the single-crystal ingot is determined by the strength of an upper end portion of the opening of the crucible. Therefore, as long as high strength is guaranteed for the upper opening end portion of the crucible, although only the upper opening end portion of the crucible is in a crystalline structure and other portions (practically, below the ingot-pulling start line of the silicon melt surface) are in an amorphous structure, the vitreous silica crucible maintains high strength during the pulling of the single-crystal silicon ingot. Therefore, deformation and distortion of the vitreous silica crucible can be prevented.

As described above with reference to the conventional vitreous silica crucible, when the vitreous silica crucible in which the crystallization promoter exists is used for pulling the single-crystal silicon ingot, the vitreous silica crucible further crystallizes during the pulling of the single-crystal ingot by the action of the crystallization promoter, and fine crystals are obtained. As a result, crystal grain boundaries increase, reaction of Si+SiO$_2$ actively occurs in the crystal grain boundaries, and this promotes generation of pinhole defects in the single-crystal ingot under pulling. However, it has also become apparent that when the crystallization promoter does not exist in the vitreous silica crucible, crystallization (increase in crystal grain boundaries) of the vitreous silica crucible does not proceed during pulling.

Therefore, as illustrated in FIG. 2, in the vitreous silica crucible according to the invention, a ring-shaped cut-off portion corresponding to a portion extended upward from the upper end of the opening of the crucible is provided to the high-purity vitreous silica during molding of the vitreous silica crucible, and a crystallization promoter that is composed of one or more kinds selected from the group consisting of aluminum oxide (hereinafter, represented as Al$_2$O$_3$), calcium oxide (hereinafter, represented as CaO), barium oxide (hereinafter, represented as BaO), calcium carbonate (hereinafter, represented as CaCO$_3$), and barium carbonate (hereinafter, represented as BaCO$_3$), is added to the ring-shaped cut-off portion. When the crystallization promoter to be added accounts for 0.01 to 1 mass % of the total amount of the crystallization promoter and the high-purity vitreous silica to melt and mold the vitreous silica crucible material, the upper opening end portion of the vitreous silica crucible main body becomes a crystalline structure. Here, the results showed that in the portion between the upper opening end of the vitreous silica crucible and the ingot-pulling start line of a silicon melt surface in the step of pulling a single-crystal silicon ingot, a portion corresponding to 40 to 100 volume % from the upper opening end of the crucible is set to be in the crystalline structure, the large-diameter vitreous silica crucibles with inner diameters of 610 to 810 mm obtain high strength without generation of deformation, distortion, and the like upon pulling the single-crystal ingot.

After melting and molding the vitreous silica crucible material, in the vitreous silica crucible main body from which the ring-shaped cut-off portion including the crystallization promoter is removed, the crystallization promoter does not exist. Therefore, the amorphous portions (remaining portions excluding the crystallized portions between the upper opening end of the vitreous silica crucible main body and the ingot-pulling start line of the silicon melt surface) do not further crystallize during the pulling of the single-crystal ingot and remain in the amorphous structure. Accordingly, generation of the SiO gas can be significantly suppressed as compared with the crystalline structure, and correspondingly, generation of pinhole defects in the single-crystal ingot can also be suppressed. This phenomenon also occurred in the large-diameter single-crystal ingot with the diameter of 200 to 300 mm.

SUMMARY OF THE INVENTION

The invention is based on the research results and provides a vitreous silica crucible which has high strength and is used for pulling a large-diameter single-crystal ingot, including a double laminated structure constituted by an outer layer composed of high-purity amorphous silica glass with a bubble content of 1 to 10% and a purity of 99.99% or higher and an inner layer composed of high-purity amorphous silica glass with a bubble content of 0.6% or less and a purity of 99.99% or higher, wherein in a ring-shaped cut-off portion of the high-purity vitreous silica corresponding to a portion extended upward from the upper opening end of the crucible during molding of the vitreous silica crucible, a crystallization promoter which accounts for 0.01 to 1 mass % of the total amount of the crystallization promoter and the high-purity vitreous silica and is composed of one or more kinds selected from the group consisting of Al$_2$O$_3$, CaO, BaO, CaCO$_3$, and BaCO$_3$, is added; and by the action of the crystallization promoter, in the portion between the upper opening end of the vitreous silica crucible and the ingot-pulling start line of the silicon melt, a portion corresponding to 40 or higher volume % from the upper opening end of the crucible is in a crystalline structure free from the crystallization promoter.

The invention relates to a method of manufacturing a vitreous silica crucible having high strength and the vitreous silica crucible described as follows.

[1] A method of manufacturing a high-purity vitreous silica crucible which has high strength, is used for pulling a large-diameter single-crystal silicon ingot, and includes a double laminated structure constituted by an outer layer composed of amorphous silica glass with a bubble content of 1 to 10% and a purity of 99.99% or higher and an inner layer composed of amorphous silica glass with a bubble content of 0.6% or less and a purity of 99.99% or higher, includes: a raw material molding step of molding silica powder as a raw material into a silica powder compact; a melting step of melting the silica powder compact into a glass crucible material; and a rim-cutting step of cutting an end portion of the opening side of the glass crucible material as a cut-off portion in a ring shape, wherein, in the raw material molding step, a crystallization promoter is added to the portion corresponding to the cut-off portion, and wherein the crystallization promoter to be added to the ring-shaped cut-off portion, which accounts for 0.01 to 1 mass % of the total amount of the crystallization promoter and the high-purity vitreous silica, is composed of one or more kinds selected from the group consisting of Al$_2$O$_3$, CaO, BaO, CaCO$_3$, and BaCO$_3$; and by the action of the crystallization promoter, in the portion between the upper opening end of the high-purity vitreous silica crucible and the ingot-pulling start line of a silicon melt surface in the step of pulling a single-crystal silicon ingot, a portion corresponding to 40 to 100 volume % from the upper opening end of the crucible is set to be in a crystalline structure free from the crystallization promoter.

[2] The high-purity vitreous silica crucible which has high strength, is used for pulling a large-diameter single-crystal silicon ingot, and manufactured by the manufacturing method according to [1], includes a double laminated structure constituted by an outer layer composed of amorphous silica glass with a bubble content of 1 to 10% and a purity of 99.99% or higher and an inner layer composed of amorphous vitreous silica with a bubble content of 0.6% or less and a purity of 99.99% or higher, and in the portion between the upper opening end of the high-purity vitreous silica crucible and the ingot-pulling start line of a silicon melt surface in the step of pulling a single-crystal silicon ingot, a portion corresponding to 40 to 100 volume % from the upper opening end of the crucible is in a crystalline structure free from the crystallization promoter.

In the vitreous silica crucible according to the invention, the crystallization promoter is added to the ring-shaped cut-off portion at a ratio of the crystallization promoter to the total amount of the crystallization promoter and the vitreous silica crucible of 0.01 to 1 mass %. When the ratio of the crystallization promoter is less than 0.01 mass %, the ratio of the crystalline structure in the upper opening end portion of the vitreous silica crucible main body from the upper opening end of the crucible cannot be 40 volume % or higher, and a desired high strength of the vitreous silica crucible main body cannot be guaranteed. As a result, in the large-diameter vitreous silica crucible with the inner diameter of 610 to 810 mm, deformation, distortion, and the like caused by lack of strength may easily occur. On the other hand, when the ratio of the crystallization promoter is greater than 1 mass %, during the melting and molding of the vitreous silica crucible, a portion below the ingot-pulling start line of the silicon melt surface begins to crystallize toward the inner portion of the crucible, and the crystalline structure may extend to an area contacting the silicon melt. When the crystalline structure reaches the area contacting the silicon melt, a large amount of SiO gas is generated from the crystal grain boundaries, and pinhole defects may easily occur in the single-crystal ingot.

The vitreous silica crucible of the invention is used for pulling the large-diameter single-crystal ingot with a diameter of 200 to 300 mm. Even when the crucible has a large inner diameter such as of 610 to 810 mm, due to the crystalline structure formed at the portion corresponding to 40 to 100 volume % in the portion between the upper opening end portion of the vitreous silica crucible and the ingot-pulling start line of the silicon melt surface, the vitreous silica crucible can guarantee high strength to prevent generation of deformation, distortion, and the like. In addition, since after molding the vitreous silica crucible, the crystallization promoter does not exist therein, the inner surface of the crucible contacting the silicon melt may be practically maintained in the amorphous structure during pulling of the single-crystal ingot. Therefore, reaction between the inner surface of the crucible and the silicon melt can further be suppressed as compared with the crystalline structure, and consequently, generation of pinhole defects in the single-crystal ingot caused by the generated SiO gas can be suppressed.

DETAILED DESCRIPTION OF THE INVENTION

Figure 5:
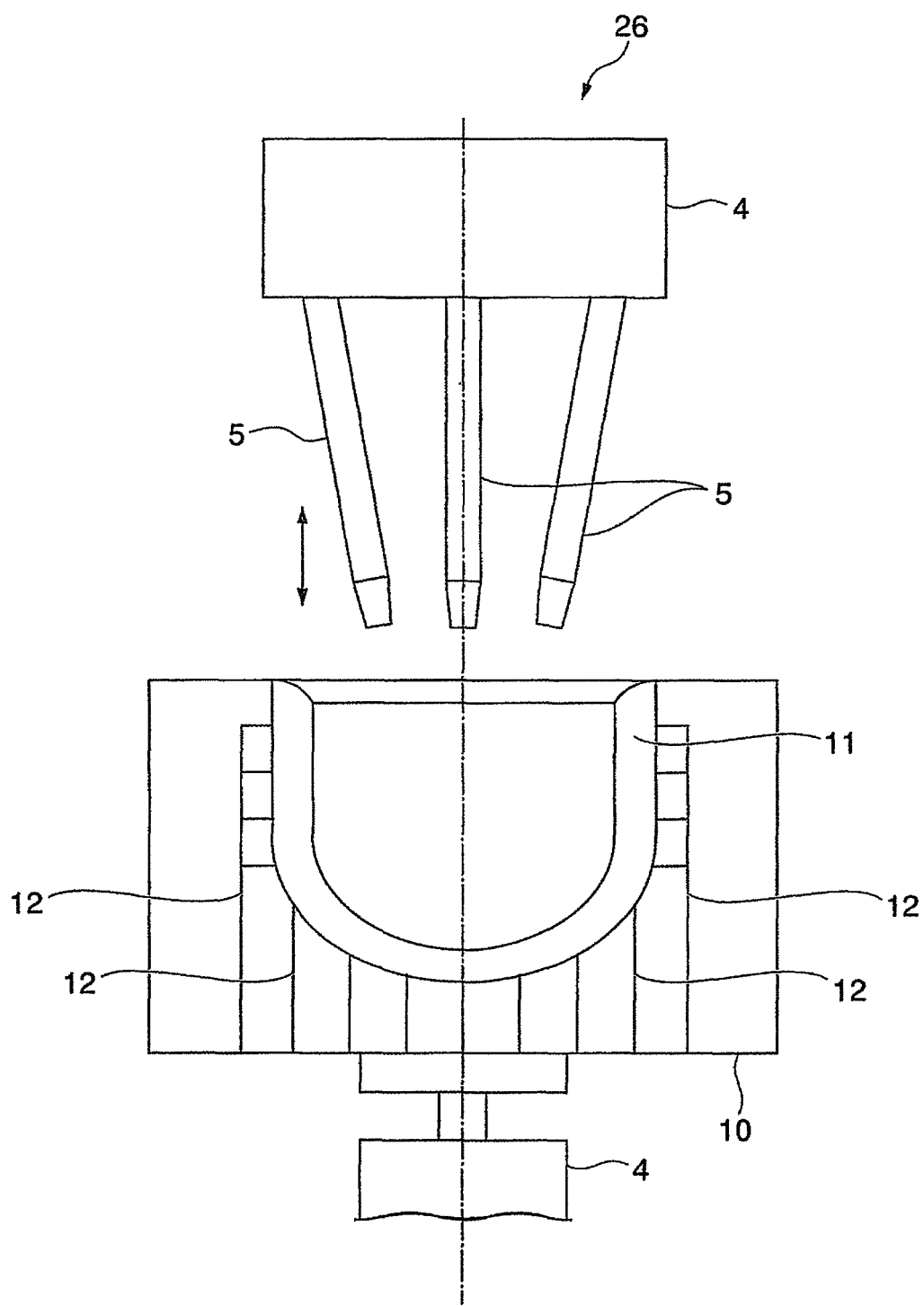
FIG. 5 is a longitudinal sectional view illustrating an example of an apparatus for manufacturing a vitreous silica crucible according to the invention.

FIG. 5 illustrates an example of an apparatus for manufacturing a vitreous silica crucible. The apparatus mainly includes a vitreous silica compact 11 in a cylindrical shape with a base, a driving mechanism 4 which rotates a graphite mold 10 on the axis, and an arc discharger 20 for heating the inner side of the graphite mold 10. The graphite mold 10 is formed of, for example, carbon, and a number of air passages 12 which are open to the inner surface of the graphite mold 10 are formed inside. The air passage 12 is connected with a pressure-reducing mechanism (not shown) which thus allows a suction of air from the inner side of the mold 10 via the air passage 12 at the time of rotating the graphite mold 10. On the inner surface of the graphite mold 10, vitreous silica powder may be accumulated to form the vitreous silica powder compact 11. The vitreous silica powder compact 11 is maintained on the inner wall by centrifugal force due to rotation of the graphite mold 10. The maintained vitreous silica powder compact 11 is heated by the arc discharger 20 and decompressed via the air passages 12 to be melted and form a vitreous silica layer. After cooling, the vitreous silica crucible is taken out of the graphite mold 10 and shaped, thereby manufacturing the vitreous silica crucible.

The arc discharger 26 includes a plurality of graphite electrodes 5 in a shape of a bar formed of high-purity carbon, an electrode driving mechanism 4 which supports and allows the graphite electrodes 5 to move together, and a power supply device (not shown) for supplying current through each graphite electrode 5. In the illustrated example, three graphite electrodes 5 are provided. However, as long as arc discharge is performed between the graphite electrodes 5, two, or four or more graphite electrodes may be employed. In addition, the shape of the graphite electrodes 5 is not limited. The graphite electrodes 5 are disposed so that distances therebetween are decreased in a direction toward front ends thereof. The power may be AC or DC. In this embodiment, the three graphite electrodes 5 are connected with three respective phases of three-phase AC current.

Next, Examples of the vitreous silica crucible according to the invention will be described in detail.

Figure 1:
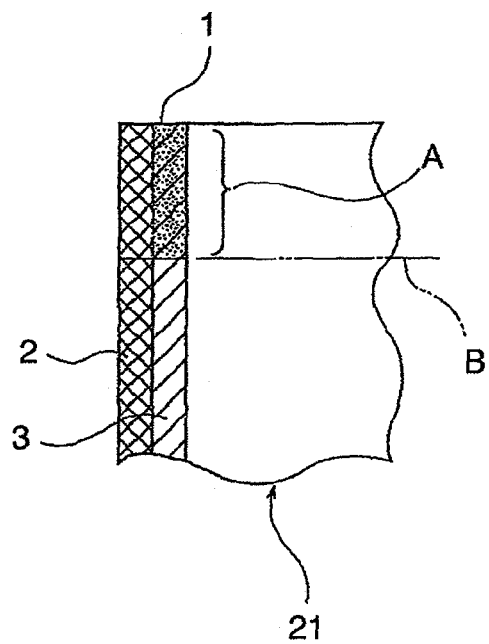
FIG. 1 is a longitudinal sectional view schematically illustrating a main portion representing an upper end portion of the opening of a vitreous silica crucible according to the invention.
Figure 2:
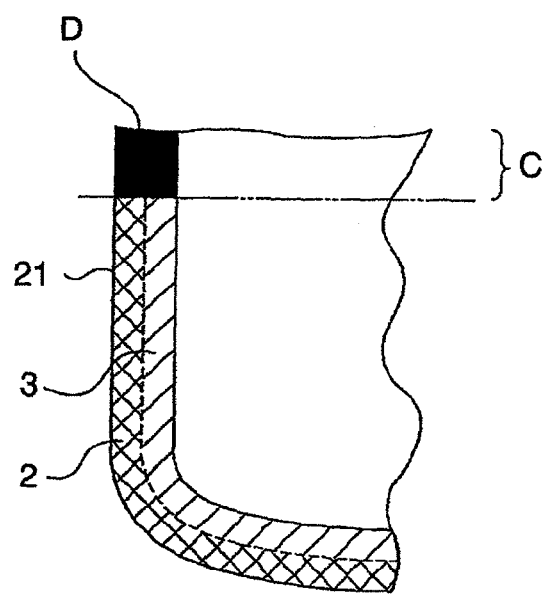
FIG. 2 is a longitudinal sectional view schematically illustrating half of a vitreous silica crucible material according to the invention.
Figure 3A:
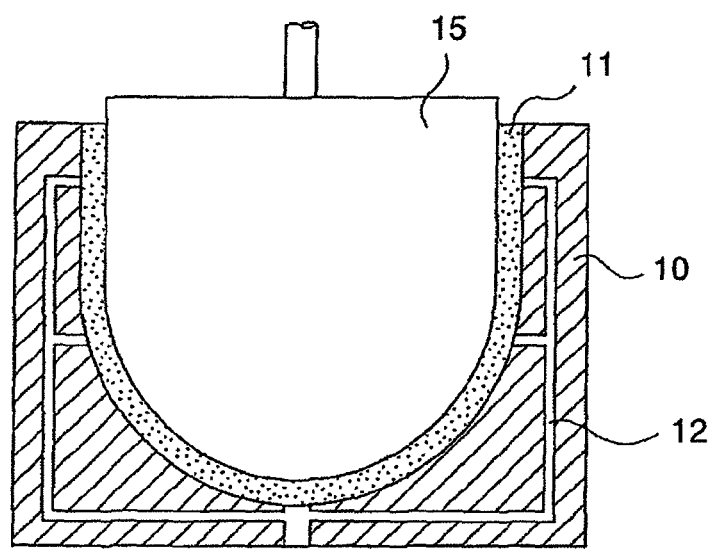
FIG. 3A is a view illustrating a raw powder filled in a manufacturing process of a vitreous silica crucible.
Figure 3B:
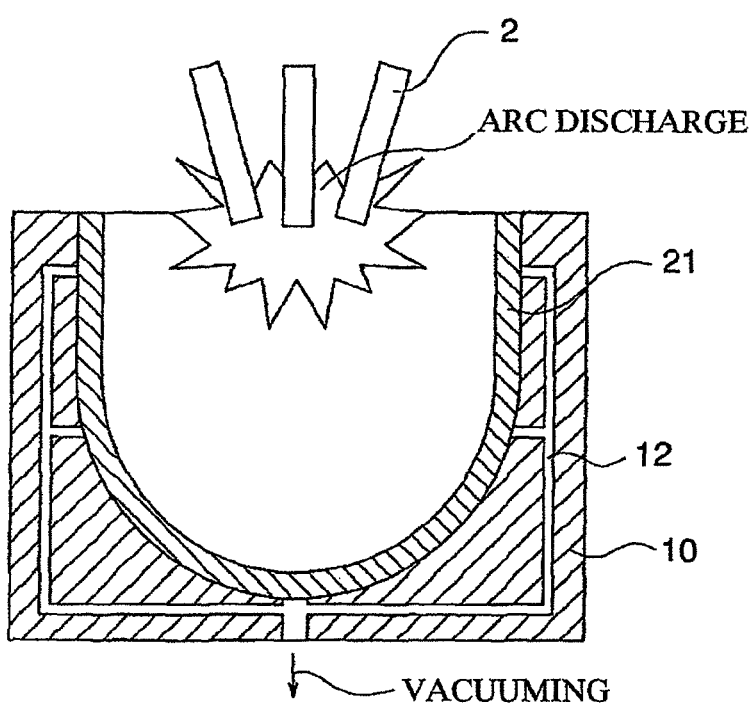
FIG. 3B is a view illustrating the vitreous silica crucible under melting and molding.

EXAMPLES (A) According to the manufacturing process illustrated in FIGS. 3A and 3B, under normal conditions, in order to form the vitreous silica powder compact, as a raw powder, high-purity vitreous silica powder with an average particle size of 250 μm and a purity of 99.998 mass % was used. Here, a gap of 30 mm formed between the inner surface of the graphite mold and the outer surface of the core was filled with the raw powder while the graphite mold and the core were rotated at a speed of 65 rpm. In addition, in order to form the ring-shaped cut-off portion, the opening portion of the vitreous silica powder compact was extended upward from the upper end of the opening to a height (width) of 20 mm, thereby forming the ring-shaped cut-off portion. For the ring-shaped cut-off portion, a mixed raw powder was obtained by mixing the raw powder with the crystallization promoter at a ratio represented in Table 1, and filled. After filling the gap, the core was removed, and while the graphite mold was rotated at the speed of 65 rpm, the three-phase AC arc discharger using the graphite electrodes was inserted through the upper opening and vertically reciprocated with respect to the inner surface of the graphite mold to heat the inside of the graphite mold to a temperature of about 2,000° C. In addition, while allowing the vacuum of the vitreous silica powder compact through the air passages which were open to the inner surface of the graphite mold, the raw powder was melted and solidified, thereby forming the vitreous silica crucible of the invention in a structure including the ring-shaped cut-off portion containing the crystallization promoter with the height (width) of 20 mm as illustrated in FIG. 2. Next, by cutting and removing the ring-shaped cut-off portion from the vitreous silica crucible material of the invention using a diamond cutter, vitreous silica crucibles 1 to 9 of the invention, each of which had an outer diameter of 610 mm, a depth of 400 mm, and a thickness of 10 mm, had the ingot-pulling start line of a silicon melt surface which was the position below the upper opening end of the crucible by 40 mm, included a double laminated structure constituted by an inner layer composed of high-purity vitreous silica with a bubble content of 0.1%, a purity of 99.994%, and a thickness of 12 mm and an outer layer composed of high-purity vitreous silica with a bubble content of 4.5%, a purity of 99.998%, and a thickness of 8 mm, and had the upper end portion of the crucible in the structure free from the crystallization promoter as illustrated in FIG. 1, so as to be used for pulling a single-crystal ingot with a diameter of 200 mm, were manufactured. Here, 5 samples were manufactured for each of the vitreous silica crucibles 1 to 9 of the invention.

(B) By setting the height (width) of ring-shaped cut-off portion to 50 mm, and setting the ratio of the mixed crystallization promoter as represented in Table 1, and according to the same manufacturing process as that used for manufacturing the vitreous silica crucibles 1 to 9 of the invention described in (A), vitreous silica crucibles 10 to 18 of the invention, each of which had an outer diameter of 810 mm, a depth of 480 mm, and a thickness of 10 mm, had the ingot-pulling start line of a silicon melt surface which was the position below the upper opening end of the crucible by 50 mm, included a double laminated structure constituted by an inner layer composed of high-purity vitreous silica with a bubble content of 10.1%, a purity of 99.997%, and a thickness of 2 mm and an outer layer composed of high-purity vitreous silica with a bubble content of 4.5%, a purity of 99.998%, and a thickness of 18 mm, and had the upper opening end portion of the crucible in the structure free from the crystallization promoter as illustrated in FIG. 1, so as to be used for a pulling single-crystal ingot with a diameter of 300 mm, were manufactured. Here, 5 samples were manufactured for each of the vitreous silica crucibles 10 to 18 of the invention.

(C) According to the manufacturing process illustrated in FIGS. 3A and 3B, under normal conditions, in order to form the vitreous silica powder compact, as a raw powder, high-purity vitreous silica powder with an average particle size of 250 μm and a purity of 99.998 mass % was used. Here, a gap of 30 mm formed between the inner surface of the graphite mold and the outer surface of the core was filled with the raw powder to a position shorter than the final crucible size by 10 mm while the graphite mold and the core were rotated at the speed of 65 rpm. Next, the raw powder was mixed with the crystallization promoter at the ratio represented in Table. 1, and the mixed raw powder was filled to the height equal to the final crucible size. After filling the gap, the core was removed, and while the graphite mold was rotated at the speed of 65 rpm, the three-phase AC arc discharger using the graphite electrodes was inserted through the upper opening and vertically reciprocated with respect to the inner surface of the graphite mold to heat the inside of the graphite mold to a temperature of about 2,000° C. In addition, while the vitreous silica powder compact was vacuumized through the air passages which were open to the inner surface of the graphite mold, the raw powder was melted and solidified, thereby manufacturing conventional vitreous silica crucibles, each of which contained the crystallization promoter between the upper opening end and a position below the upper opening end by 10 mm in the upper opening end portion of the crucible, had an outer diameter of 610 mm, a depth of 400 mm, and a thickness of 10 mm, had the ingot-pulling start line of a silicon melt surface that was a position below the upper opening end of the crucible by 40 mm, included a double laminated structure constituted by an inner layer composed of high-purity vitreous silica with a bubble content of 0.1%, a purity of 99.994%, and a thickness of 2 mm and an outer layer composed of high-purity vitreous silica with a bubble content of 4.5%, a purity of 99.998%, and a thickness of 8 mm, and had the upper end portion of the crucible containing the crystallization promoter, so as to be used for pulling a single-crystal ingot with a diameter of 200 mm. Here, 5 samples were manufactured for each of the conventional vitreous silica crucibles 1 to 9.

(D) By containing the crystallization promoter in the portion between the upper opening end of the crucible and a position therebelow by 10 mm in the upper end portion of the crucible, and setting the ratio of the crystallization promoter that is to be contained as represented in Table 1, and according to the same manufacturing process as that used for manufacturing the conventional vitreous silica crucibles 1 to 9 described in (C), conventional vitreous silica crucibles 10 to 18, each of which had an outer diameter of 810 mm, a depth of 480 mm, and a thickness of 10 mm, had the ingot-pulling start line of a silicon melt surface which was the position below the upper opening end of the crucible by 50 mm, included a double laminated structure constituted by an inner layer composed of high-purity vitreous silica with a bubble content of 0.1%, a purity of 99.997%, and a thickness of 12 mm and an outer layer composed of high-purity vitreous silica with a bubble content of 4.5%, a purity of 99.998%, and a thickness of 8 mm, and had the upper end portion of the crucible containing the crystallization promoter, so as to be used for pulling a single-crystal ingot with a diameter of 1300 mm, were manufactured. Here, 5 samples were manufactured for each of the conventional vitreous silica crucibles 10 to 18.

Next, a crystallization rate of each of the vitreous silica crucibles 1 to 18 of the invention and the conventional vitreous silica crucibles 1 to 18 obtained according to the aforementioned process was observed using an optical microscope, and the case where the portion between the upper opening end of the crucible and the ingot-pulling start line of the silicon melt surface is entirely crystallized was given as the crystallization rate of 100 volume %. Rates with respect to the 100 volume % crystallization rate are represented in Tables 1 and 2 (sections before ingot-pulling) as averages values of the five samples of each of the crucibles.

Figure 4:
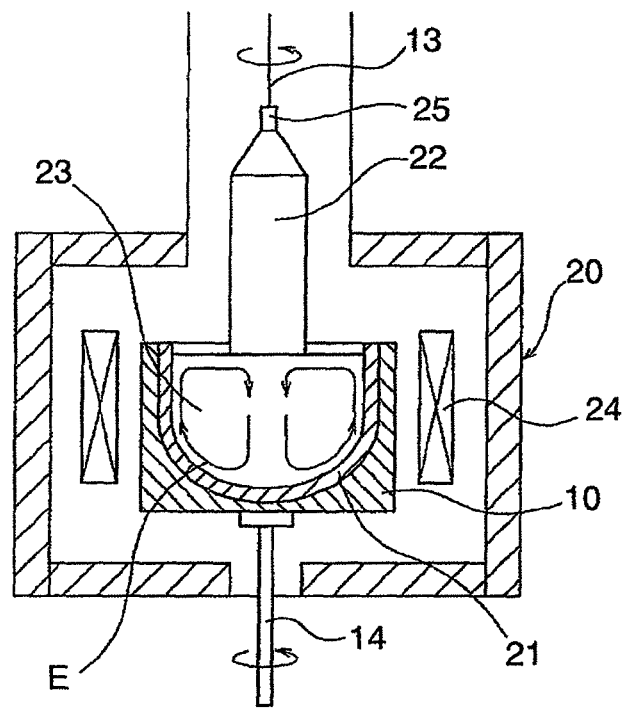
FIG. 4 is a longitudinal sectional view schematically illustrating a single-crystal ingot under pulling.

Next, by using the vitreous silica crucibles 1 to 18 of the invention and the conventional vitreous silica crucibles 1 to 18, each of which was prepared with 5 samples as described above, in normal conditions, single-crystal ingots with diameters of 200 mm and 300 mm were pulled by the pulling apparatus illustrated in FIG. 4. For each of the vitreous silica crucibles 1 to 18 of the invention and the conventional vitreous silica crucibles 1 to 18, 5 single-crystal ingots were manufactured. Here, 1,000 wafers with a thickness of 725 μm were cut from a single-crystal ingot with a diameter of 200 mm. In addition, 800 wafers with a thickness of 775 μm were cut from a single-crystal ingot with a diameter of 300 mm. Upper and lower surfaces of the wafers cut from each of the 5 single-crystal ingots were tested by using a test apparatus. In addition, the wafer having a concave of 30 μm or larger in diameter was determined as a pinhole-containing wafer, and the number of pinhole-containing wafers is represented in Tables 1 and 2.

In addition, a crystallization rate of each of the vitreous silica crucibles 1 to 18 of the invention and the conventional vitreous silica crucibles 1 to 18 from the upper opening end of the crucible after pulling the single-crystal ingots was observed using an optical microscope. Here, the case where the entire portion between the upper opening end of the crucible and the ingot-pulling start line of the silicon melt surface crystallizes was given as 100 volume %, and rates with respect to the 100 volume % crystallization rate are represented in Tables 1 and 2 (sections after ingot-pulling) as averages values of the five samples of each of the crucibles.

For each of the vitreous silica crucibles 1 to 18 of the invention and the conventional vitreous silica crucibles 1 to 18 after pulling of the single-crystal ingots, 10 inner diameters of the upper opening end of the crucible were measured along the inner circumference. As a result, in any crucible, the difference between the maximum and the minimum of the inner diameters was in the range of 1 mm or less, and this means that little deformation had occurred.

TABLE 1

| Type | | Mixing Ratio (mass %) of Crystallization Promoter of Cut-off Portion | Crystallization Rate (volume %) From Upper Opening End of Crucible | | The Number of Pinhole-Containing Wafers |
|---|---|---|---|---|---|
| | | | Before Ingot-Pulling | After Ingot-Pulling | |
| Vitreous silica Crucible of Invention | 1 | $Al_2O_3$: 1% | 98.3 | 98.9 | 31 |
| | 2 | CaO: 0.5% | 85.5 | 86.5 | 22 |
| | 3 | BaO: 0.1% | 74.3 | 75.4 | 21 |
| | 4 | $CaCO_3$: 0.05% | 64.8 | 65.8 | 24 |
| | 5 | $BaCO_3$: 0.01% | 42.0 | 42.2 | 26 |
| | 6 | $Al_2O_3$: 0.3% CaO: 0.3% | 94.1 | 94.6 | 22 |
| | 7 | CaO: 0.01% $BaCO_3$: 0.01% | 50.4 | 51.3 | 21 |
| | 8 | BaO: 0.06% $CaCO_3$: 0.04% | 72.9 | 73.8 | 20 |
| | 9 | $Al_2O_3$: 0.1% BaO: 0.2% $CaCO_3$: 0.3% | 95.2 | 95.9 | 29 |
| | 10 | $Al_2O_3$: 0.06% | 66.1 | 66.6 | 28 |
| | 11 | CaO: 0.2% | 76.4 | 76.7 | 26 |
| | 12 | BaO: 0.8% | 95.4 | 96.3 | 32 |
| | 13 | $CaCO_3$: 0.01% | 40.6 | 40.7 | 27 |
| | 14 | $BaCO_3$: 0.25% | 77.4 | 78.3 | 30 |
| | 15 | $Al_2O_3$: 0.2% BaO: 0.1% | 79.2 | 80.0 | 27 |
| | 16 | CaO: 0.35% $BaCO_3$: 0.15% | 85.7 | 85.9 | 31 |
| | 17 | $BaCO_3$: 0.3% $CaCO_3$: 0.1% | 82.5 | 83.1 | 28 |
| | 18 | $Al_2O_3$: 0.05% CaO: 0.05% $CaCO_3$: 0.05% | 75.6 | 76.5 | 26 |

TABLE 2

| Type | | Mixing Ratio (mass %) of Crystallization Promoter of Upper Opening End Portion of Crucible | Crystallization Rate (volume %) From Upper Opening End of Crucible | | The Number of Pinhole-Containing Wafers |
|---|---|---|---|---|---|
| | | | Before Ingot-Pulling | After Ingot-Pulling | |
| Conventional Vitreous silica Crucible | 1 | $Al_2O_3$: 1% | 118.8 | 361.0 | 108 |
| | 2 | CaO: 0.5% | 109.0 | 343.2 | 116 |
| | 3 | BaO: 0.1% | 97.3 | 266.7 | 107 |
| | 4 | $CaCO_3$: 0.05% | 90.5 | 257.9 | 91 |
| | 5 | $BaCO_3$: 0.01% | 64.0 | 155.9 | 98 |
| | 6 | $Al_2O_3$: 0.3% CaO: 0.3% | 112.5 | 355.7 | 103 |
| | 7 | CaO: 0.01% $BaCO_3$: 0.01% | 79.0 | 170.7 | 93 |
| | 8 | BaO: 0.06% $CaCO_3$: 0.04% | 90.8 | 254.1 | 99 |
| | 9 | $Al_2O_3$: 0.1% BaO: 0.2% $CaCO_3$: 0.3% | 114.6 | 356.4 | 111 |
| | 10 | $Al_2O_3$: 0.06% | 92.8 | 263.4 | 118 |
| | 11 | CaO: 0.2% | 94.4 | 314.6 | 117 |
| | 12 | BaO: 0.8% | 113.9 | 358.2 | 124 |
| | 13 | $CaCO_3$: 0.01% | 60.2 | 149.7 | 110 |
| | 14 | $BaCO_3$: 0.25% | 95.9 | 316.0 | 115 |
| | 15 | $Al_2O_3$: 0.2% BaO: 0.1% | 96.8 | 321.2 | 124 |
| | 16 | CaO: 0.35% $BaCO_3$: 0.15% | 108.9 | 331.7 | 121 |
| | 17 | $BaCO_3$: 0.3% $CaCO_3$: 0.1% | 105.3 | 328.6 | 127 |
| | 18 | $Al_2O_3$: 0.05% CaO: 0.05% $CaCO_3$: 0.05% | 99.8 | 274.1 | 122 |

From results represented in Tables 1 and 2, it can be clearly seen that even when the vitreous silica crucibles 1 to 18 of the invention used for pulling a large-diameter single-crystal ingot with a diameter of 200 to 300 mm are manufactured to have large outer diameters such as of 610 to 810 mm, due to the crystalline structure formed at the portion corresponding to 40 or more volume % from the upper opening end of the crucible in the portion between the upper opening end of the crucible and the ingot-pulling start line of the silicon melt surface, the crucibles have high strength to suppress deformation of the crucibles during pulling of the single-crystal ingot. Since the crystallization promoter does not exist in the upper opening end portion of the crucible, crystallization by the crystallization promoter does not proceed. Therefore, the inner surface of the crucible practically contacting the silicon melt is maintained in the amorphous structure during pulling of the single-crystal ingot. Accordingly, reaction between the inner surface of the crucible and the silicon melt can further be suppressed than in the crystalline structure, and generation of pinhole defects in the single-crystal ingot caused by the generated SiO gas can be suppressed. On the other hand, in the conventional vitreous silica crucibles 1 to 18, although the upper opening end portion of the crucible is in the crystalline structure and has high strength to suppress deformation of the crucible during pulling of the single-crystal ingot, since the crystallization promoter exists in the upper opening end portion of the crucible, the portion below the ingot-pulling start line of the silicon melt surface crystallizes toward the inner portion of the crucible during the pulling of the single-crystal ingot. Accordingly, some areas of the crystalline structure contacts the silicon melt, SiO gas are actively generated from crystal grain boundaries in the area thereof, and pinhole defects in the single-crystal ingot easily occur.

As described above, the vitreous silica crucibles of the invention are suitable for pulling a large-diameter single-crystal ingot with a diameter of 200 to 300 mm and contribute to an increase in yield and quality of large-diameter single-crystal silicon wafers.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A high-purity vitreous silica crucible having an inner diameter of 610 to 810 mm and used for pulling a single-crystal silicon ingot with a diameter of 200 to 300 mm, the crucible comprising:
    a double laminated structure constituted by an outer layer composed of amorphous vitreous silica with a bubble content of 1 to 10% and a purity of 99.99% or higher and an inner layer composed of amorphous silica glass with a bubble content of 0.6% or less and a purity of 99.99% or higher, wherein:
40 to 100 volume % of the inner layer of the crucible from the upper opening end of the crucible to 40 or 50 mm below the upper opening end is in a crystalline structure free from a crystallization promoter, the volume % of the crystalline being observed using an optical microscope,
the remainder of the inner layer of the crucible is in the amorphous silica glass structure free from the crystallization promoter,
thickness of the inner layer is 2 mm, and
the volume % of the entire portion from the upper opening end of the crucible to 40 or 50 mm below the upper opening end is established as 100 volume %, and the volume % of the crystalline structure with respect to the 100 volume % is represented as the crystallization rate.

* * * * *